(12) United States Patent
Hirota et al.

(10) Patent No.: US 6,861,883 B2
(45) Date of Patent: Mar. 1, 2005

(54) SEMICONDUCTOR INTEGRATED CIRCUIT FOR PHASE MANAGEMENT OF CLOCK DOMAINS INCLUDING PLL CIRCUIT

(75) Inventors: Takanori Hirota, Tokyo (JP); Atsuhiko Ishibashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 222 days.

(21) Appl. No.: 10/360,754

(22) Filed: Feb. 10, 2003

(65) Prior Publication Data

US 2004/0027157 A1 Feb. 12, 2004

(30) Foreign Application Priority Data

Aug. 9, 2002 (JP) ........................................ 2002-233084

(51) Int. Cl.[7] ................................................ H03L 7/06
(52) U.S. Cl. ........................................ 327/149; 327/158
(58) Field of Search ................................ 327/149, 153, 327/156, 158, 161; 331/1 R, 25; 375/373, 374, 375, 376

(56) References Cited

U.S. PATENT DOCUMENTS

| 4,689,581 A | 8/1987 | Talbot | ........................ 331/1 A |
| 5,081,428 A | 1/1992 | Atriss et al. | ................... 331/57 |
| 5,270,592 A | 12/1993 | Takahashi et al. | ........... 326/101 |
| 5,815,540 A | * 9/1998 | Aoki | ............................ 375/376 |
| 6,346,830 B1 | * 2/2002 | Ishikawa | ....................... 326/93 |

OTHER PUBLICATIONS

Albert Thaik, et al., "A Dual PLL Based Multi Frequency Clock Distribution Scheme", 1992 Symposium on VLSI Circuits Digest of Technical Papers, 1992, pp. 84–85.

* cited by examiner

Primary Examiner—Linh My Nguyen
(74) Attorney, Agent, or Firm—Oblon, Spivak, McClelland, Maier & Neustadt, P.C.

(57) ABSTRACT

Assuming that clocks in an A clock driver (102), a B clock driver (103) and a CMOS buffer circuit (119) have delay values Ta, Tb and Td, respectively, a delay value Ta–Td is stored in a register circuit (117) when terminals "0" of selector circuits (114, 115, 116) are selected, and a delay value Ta–Td–Tb is stored in a register circuit (118) when the terminals "0" are switched to "1". Thus, determining a delay value at the CMOS buffer circuit (119) allows a phase difference between the A clock driver (102) and B clock driver (103) to be determined.

8 Claims, 15 Drawing Sheets

F I G. 1
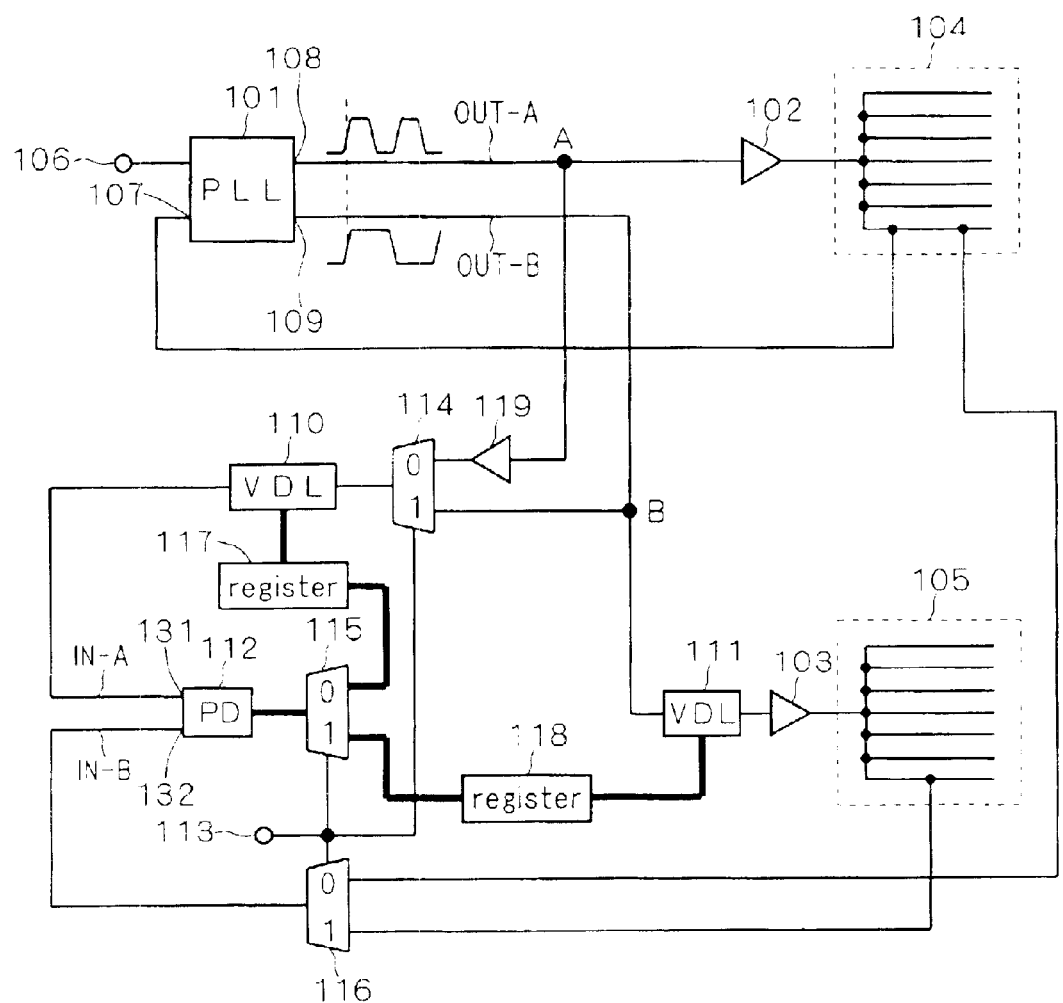

F I G . 4
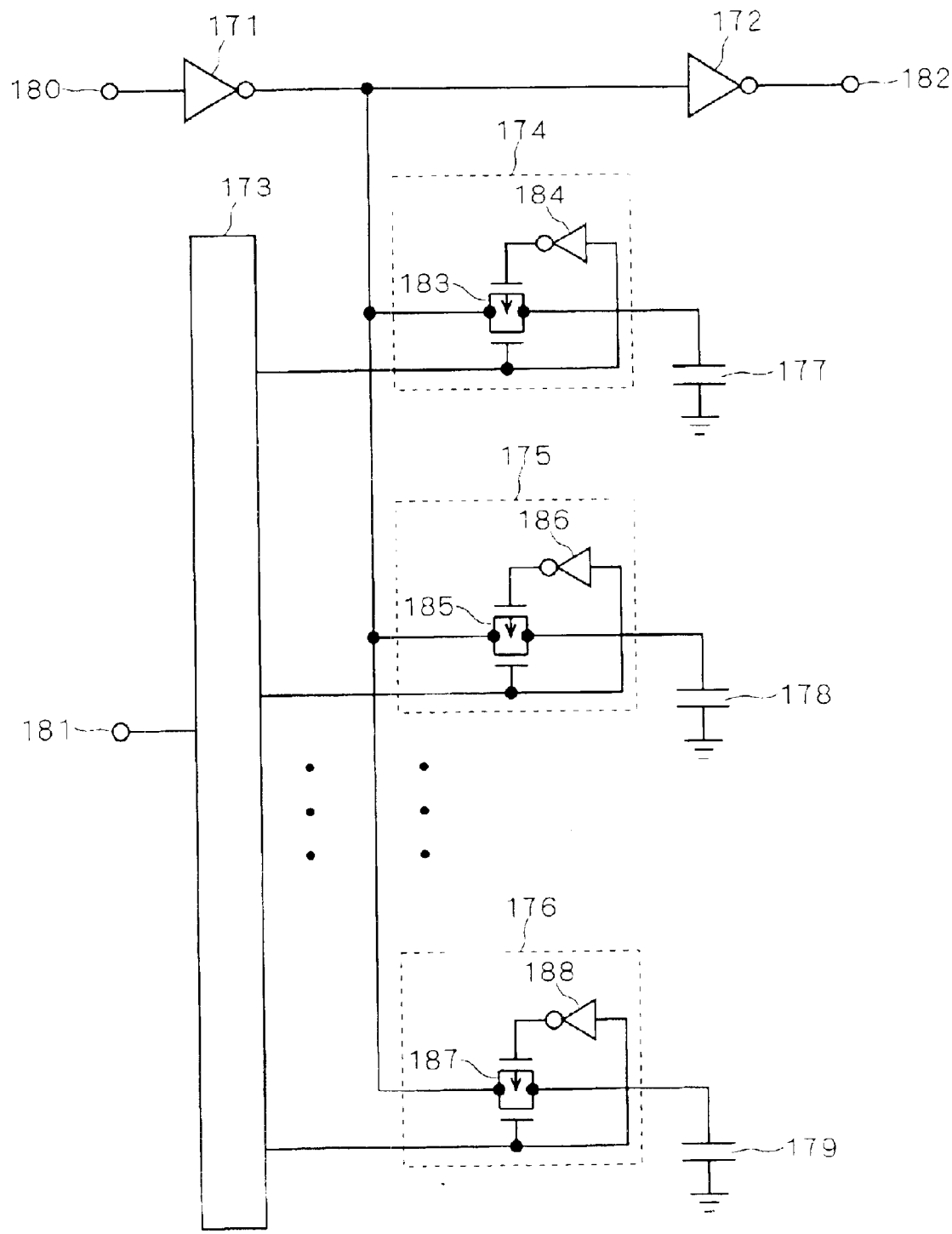

F I G. 5
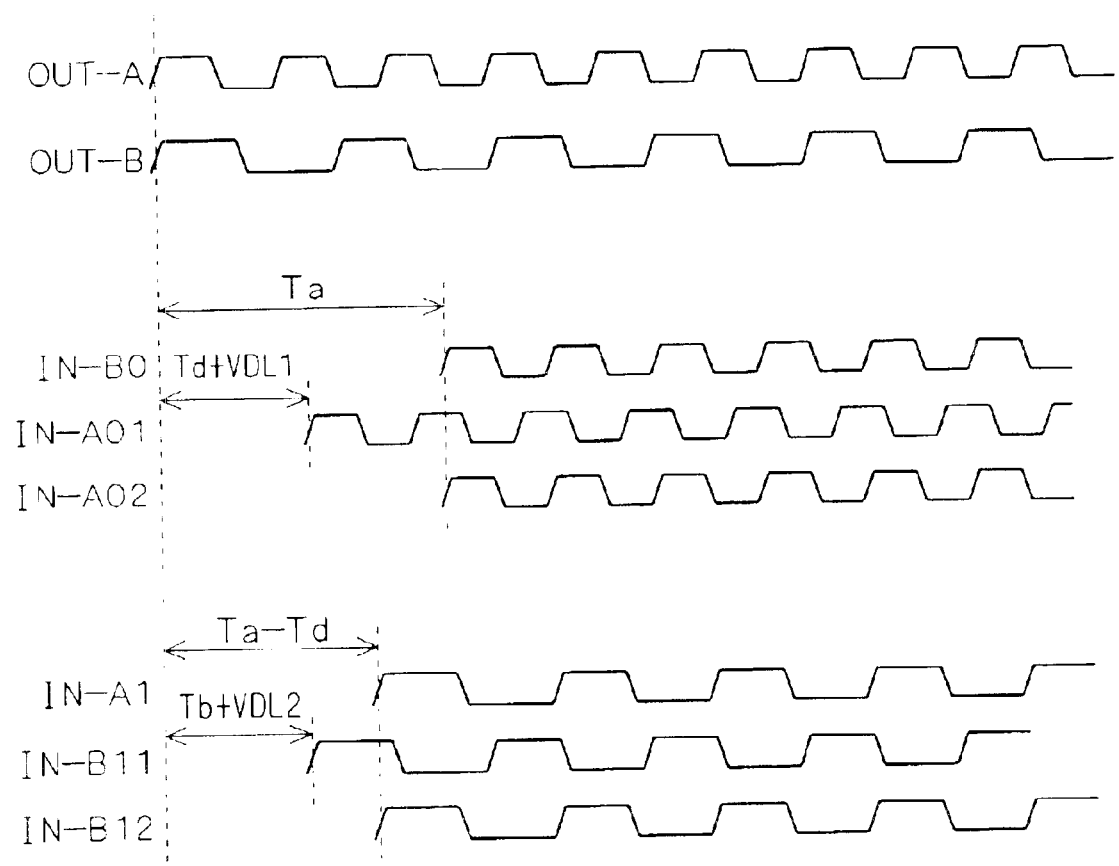

F I G. 15
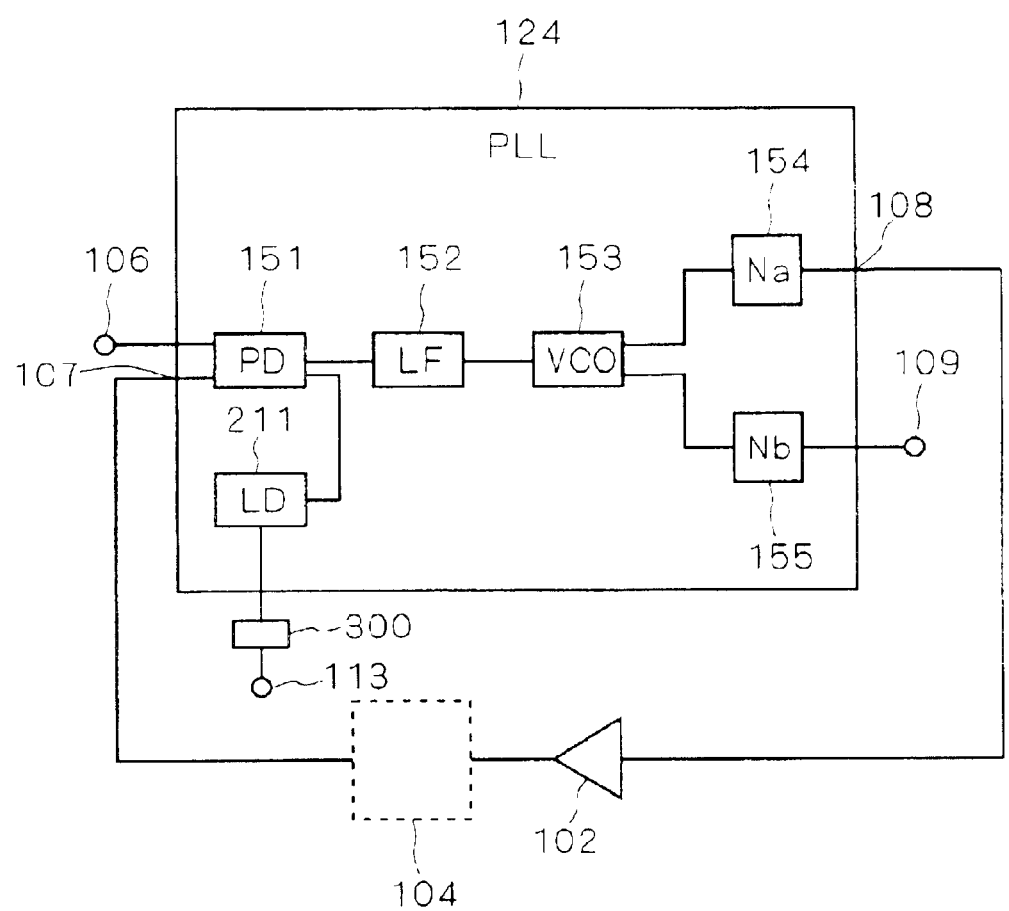

SEMICONDUCTOR INTEGRATED CIRCUIT FOR PHASE MANAGEMENT OF CLOCK DOMAINS INCLUDING PLL CIRCUIT

BACKGROUND OF THE INVENTION

1. Field of the Invention

The present invention relates to a semiconductor integrated circuit, and more particularly, to a technique of performing easy and highly accurate phase management between a plurality of clock domains in synchronization with each other by means of a PLL (phase locked loop) circuit.

2. Description of the Background Art

FIG. 19 is a circuit diagram showing phase management between a plurality of clock domains in a conventional semiconductor integrated circuit which operates in synchronization with clock signals.

A PLL circuit 501 includes a reference clock input terminal 506 to which a reference clock is inputted and a feedback clock input terminal 507 to which a feedback clock is inputted. The PLL circuit 501 further includes an A clock output terminal 508 outputting an A clock, which is connected to an input terminal of a CMOS buffer circuit 510. An A clock from the A clock output terminal 508 will be referred to as OUT-A. The CMOS buffer circuit 510 has a delay value Td for use in phase management between the clock domains. An output part of the CMOS buffer circuit 510 is connected to an input terminal of an A clock driver 502 serving as a clock distributing circuit. An A clock distributed by the A clock driver 502 is transmitted to an A clock domain 504. An A clock on the A clock domain 504 is inputted to the feedback clock input terminal 507 of the PLL circuit 501. The PLL circuit 501 further includes a B clock output terminal 509 outputting a B clock. A B clock from the B clock output terminal 509 will be referred to as OUT-B. The B clock output terminal 509 is connected to an input terminal of a B clock driver 503 serving as a clock distributing circuit. A B clock distributed by the B clock driver 503 is transmitted to a B clock domain 505.

Next, the operation of the circuit shown in FIG. 19 will be described.

The PLL circuit 501 generates A clock and B clock each having a predetermined frequency and phase based on a reference clock inputted to the reference clock input terminal 506 and a feedback clock inputted to the feedback clock input terminal 507. The A clock and B clock differ in frequency but are in phase with each other.

An A clock outputted from the A clock output terminal 508 is delayed by Td at the CMOS buffer circuit 510, and is thereafter inputted to the A clock driver 502. The A clock driver 502 distributes the A clock to the A clock domain 504. A B clock outputted from the B clock output terminal 509 is inputted to the B clock driver 503. The B clock driver 503 distributes the B clock to the B clock domain 505. An example in which a plurality of clocks are distributed within a semiconductor integrated circuit device is described in U.S. Pat. No. 5,270,592 entitled "CLOCK SUPPLY CIRCUIT LAYOUT IN A CIRCUIT AREA", and an example in which a PLL circuit is formed in a semiconductor integrated circuit device for generating clock signals is described in U.S. Pat. No. 4,689,581 entitled "INTEGRATED CIRCUIT PHASE LOCKED LOOP TIMING APPARATUS" and "A Dual PLL Based Multi Frequency Clock Distribution Scheme" (1992 Symposium on VLSI Circuits Digest of Technical Papers, pp. 84–85).

Generally, the A clock transmitted to the A clock domain 504 and the B clock transmitted to the B clock domain 505 need to be managed to keep a predetermined phase difference therebetween. On the other hand, when the A clock driver 502 and B clock driver 503 have different delay values from each other, the phase difference between the A clock inputted to the A clock domain 504 and the B clock inputted to the B clock domain 505 is somewhat different from the predetermined phase difference. Thus, management of the phase difference between the A and B clocks has been performed by estimating the respective delay values of the A clock driver 502 and B clock driver 503 by circuit simulations and providing the desired delay value Td for the CMOS buffer circuit 510 factoring in the estimated difference in the delay values.

Phase management between a plurality of clock domains in a conventional semiconductor integrated circuit has been performed as described above. Thus, a problem arises in that estimating delay values by circuit simulations is time-consuming, causing the design period to be prolonged.

Another problem arises in that an estimation error is so great that the phase management is degraded in accuracy.

SUMMARY OF THE INVENTION

An object of the present invention is to provide a semiconductor integrated circuit device capable of performing easy and highly accurate phase management between clock domains to which clocks having different frequencies from each other are inputted.

The present invention is directed to a semiconductor integrated circuit including a phase locked loop circuit, a first clock driver, a second clock driver, a first variable delay circuit, a second variable delay circuit, a selector circuit and a phase difference introducing circuit. The phase locked loop circuit is configured to generate a first clock and a second clock. The first clock driver is configured to distribute the first clock to a first clock domain. The second clock driver is configured to distribute the second clock to a second clock domain. The first variable delay circuit is provided on a first phase comparison loop including the first clock driver and a phase comparator. The first variable delay circuit has a delay determined by an output of the phase comparator. The second variable delay circuit is provided on a second phase comparison loop including the second clock driver, the first variable delay circuit and the phase comparator. The second variable delay circuit has a delay determined by an output of the phase comparator. The selector circuit is configured to switch between the first phase comparison loop and the second phase comparison loop. The phase difference introducing circuit is configured such that a predetermined phase difference to be provided between the first and second clock domains is reflected in the delay of the second variable delay circuit.

The phase comparator provided on the first and second phase comparison loops can compare the delay provided for the first variable delay circuit on the first and second phase comparison loops with the delay provided for the second variable delay circuit on the second phase comparator loop, thereby providing the comparison result for the second variable delay circuit. This allows easy and highly accurate phase management to be performed between the clock domains without estimating delay values at the respective clock domains by circuit simulations.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing phase management according to a first preferred embodiment of the present invention;

FIG. 4 is a circuit diagram showing a variable delay circuit according to the first preferred embodiment;

FIG. 5 is a timing chart showing the phase management according to the first preferred embodiment;

FIG. 15 is a circuit diagram showing a PLL circuit according to the eighth preferred embodiment;

DESCRIPTION OF THE PREFERRED EMBODIMENTS

First Preferred Embodiment

Figure 2:
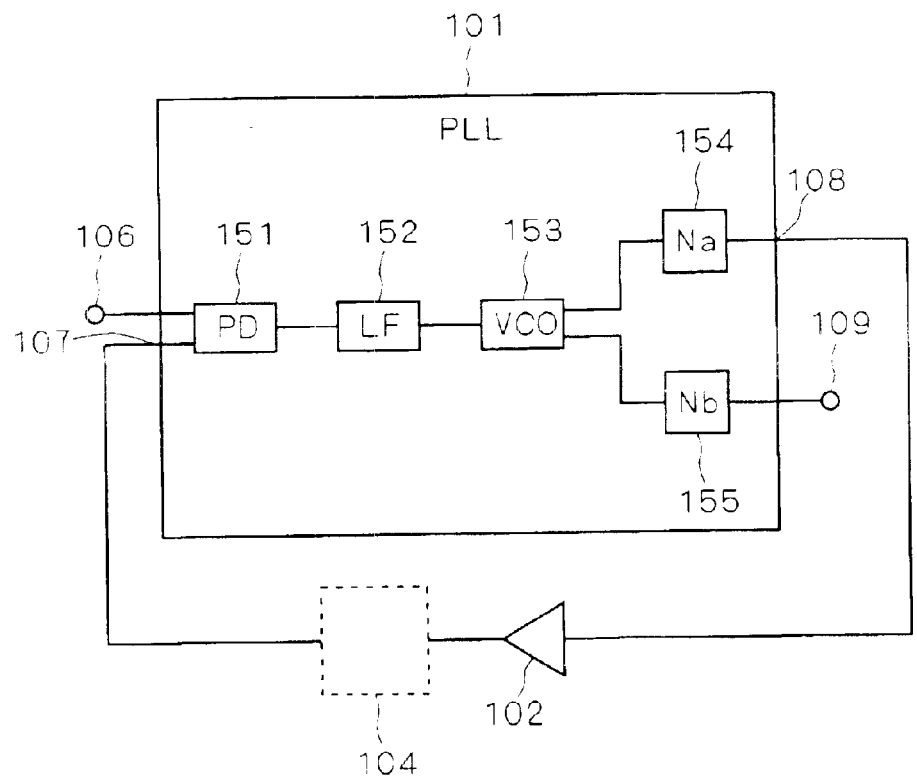
FIG. 2 is a circuit diagram showing a PLL circuit according to the first preferred embodiment.

FIG. 1 is a circuit diagram showing phase management between a plurality of clock domains in a semiconductor integrated circuit according to a first preferred embodiment of the present invention.

A PLL circuit 101 includes a reference clock input terminal 106 to which a reference clock is inputted and a feedback clock input terminal 107 to which a feedback clock is inputted. The PLL circuit 101 further includes an A clock output terminal 108 outputting an A clock. An A clock from the A clock output terminal 108 will be referred to as OUT-A.

The A clock output terminal 108 is connected to an input terminal of an A clock driver 102 serving as a clock distributing circuit through a contact A. An A clock distributed by the A clock driver 102 is transmitted to an A clock domain 104. An A clock on the A clock domain 104 is inputted to the feedback clock input terminal 107 of the PLL circuit 101 and a "0" input terminal of a selector circuit 116. The PLL circuit 101 further includes a B clock output terminal 109 outputting a B clock. A B clock from the B clock output terminal 109 will be referred to as OUT-B.

The B clock output terminal 109 is connected to an input terminal of a variable delay circuit 111 through a contact B. The variable delay circuit 111 has its output terminal connected to an input terminal of a B clock driver 103. A B clock distributed by the B clock driver 103 is transmitted to a B clock domain 105. A B clock on the B clock domain 105 is inputted to a "1" input terminal of the selector circuit 116.

The A clock output terminal 108 of the PLL circuit 101 is also connected to an input terminal of a CMOS buffer circuit 119 which has a desired delay value Td for use in phase management between the clock domains, through the contact A. The CMOS buffer circuit 119 operates as phase difference introducing circuit for introducing the phase difference required between the A clock domain 104 and the B clock domain 105 into the variable delay circuit 111. The CMOS buffer circuit 119 has its output terminal connected to a "0" input terminal of a selector circuit 114. The selector circuit 114 has its "1" input terminal connected to the B clock output terminal 109 of the PLL circuit 101 through the contact B.

The selector circuit 114 has its output terminal connected to an input terminal of a variable delay circuit 110. The variable delay circuit 110 has its output terminal connected to an input terminal 131 of a phase comparator 112. A clock inputted to the input terminal 131 of the phase comparator 112 will be referred to as IN-A. The selector circuit 116 has its output terminal connected to an input terminal 132 of the phase comparator 112. A clock inputted to the input terminal 132 of the phase comparator 112 will be referred to as IN-B.

The phase comparator 112 has its output terminal connected to an input terminal of a selector circuit 115. The selector circuit 115 has its "0" output terminal connected to an input terminal of a register circuit 117. The register circuit 117 has its output terminal connected to a control input terminal of the variable delay circuit 110. The variable delay circuit 110 varies a delay thereof using control codes inputted to the control input terminal. That is, the variable delay circuit 110 operates as a first variable delay circuit.

The selector circuit 115 has its "1" output terminal connected to an input terminal of a register circuit 118. The register circuit 118 has its output terminal connected to a control input terminal of the variable delay circuit 111. The variable delay circuit 111 varies a delay thereof using control codes inputted to the control input terminal. That is, the variable delay circuit 111 operates as a second variable delay circuit.

A select signal is inputted to select signal input terminals of the selector circuits 114, 115 and 116 from a select signal input terminal 113.

Next, the operation of the circuit shown in FIG. 1 will be described. FIG. 5 shows a timing chart.

The PLL circuit 101 generates A clock and B clock each having a predetermined frequency and phase based on a reference clock inputted to the reference clock input terminal 106 and a feedback clock inputted to the feedback clock input terminal 107. The A clock and B clock differ in frequency but are in phase with each other.

FIG. 2 shows an exemplary configuration of the PLL circuit 101. The PLL circuit 101 includes a phase comparator 151, a loop filter 152, a voltage controlled oscillator 153 and frequency dividers 154 and 155. The phase of the reference clock inputted to the reference clock input terminal 106 is compared to that of the feedback clock inputted to the feedback clock input terminal 107 at the phase comparator 151. The comparison result becomes a control voltage through the loop filter 152, for controlling oscillation of the voltage controlled oscillator 153. An oscillation output of the voltage controlled oscillator 153 is divided down into A and B clocks at the frequency dividers 154 and 155, to be outputted therefrom.

Referring back to FIG. 1, the selector circuits 114, 115 and 116 can perform switching between the respective terminals "0" and "1" in response to a select signal inputted to the select signal input terminal 113. This switching can be performed automatically by presetting the timing of switching in response to a select signal.

First, the respective "0" terminals of the selector circuits 114, 115 and 116 are made effective in response to a select signal. At this time, an A clock outputted from the A clock output terminal 108 is inputted to the input terminal 131 of the phase comparator 112 through the CMOS buffer circuit 119, selector circuit 114 and variable delay circuit 110. The A clock outputted from the A clock output terminal 108 is also inputted to the input terminal 132 of the phase comparator 112 through the A clock driver 102, A clock domain 104 and selector circuit 116. With this operation, a first phase comparison loop is formed.

Figure 3:
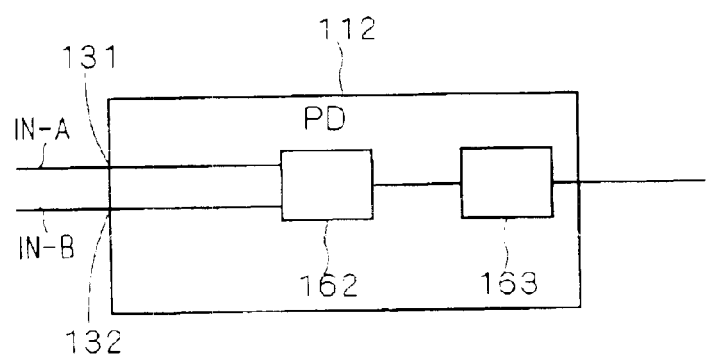
FIG. 3 is a circuit diagram showing a phase comparator according to the first preferred embodiment.

FIG. 3 shows an exemplary configuration of the phase comparator 112. The phase comparator 112 includes a phase difference detecting circuit 162 and a coding device 163. When an inputted clock IN-A leads IN-B in phase, an output signal from the phase difference detecting circuit 162 is an H level signal, whereas it is an L level signal when IN-A lags IN-B in phase. The coding device 163 generates a delay value control signal (code) based on the inputted signal and outputs it to the register circuit 117 (or 118), and the register circuit 117 (or 118) stores the delay value control signal and outputs it to the variable delay circuit 110 (or 111).

FIG. 4 shows a configuration of the variable delay circuits 110 and 111. A clock inputted to an input terminal 180 passes through inverters 171 and 172 to be outputted from an output terminal 182. A delay value control signal inputted to an input terminal 181 passes through a signal distributing circuit 173 to be inputted to the respective gates of NMOS of transfer gates 183, 185 and 187 provided for transfer gate circuits 174, 175 and 176, respectively, and input parts of inverters 184, 186, 188 and the like. Outputs from the inverters 184, 186, 188 and the like are inputted to the respective gates of PMOS of the transfer gates 183, 185 and 187. That is, the transfer gate circuits 174, 175, 176 and the like apply loads to the inverter 171 in response to the delay value control signal by connecting capacitors 177, 178, 179 and the like to an output part of the inverter 171, thereby increasing the delay value. Therefore, a delay can be created in response to the inputted delay value control signal.

Now, variations in the delay value applied to an A clock at the variable delay circuit 110 will be described referring to FIG. 5.

The variable delay circuit 110 shall have an initial delay value VDL1, and a delay value of the CMOS buffer circuit 119 shall be Td. The clock IN-A when the terminals "0" are selected shall be a clock IN-A0, and its initial state shall be IN-A01. Then, the phase difference between the clocks IN-A01 and OUT-A is represented by (Td+VDL1). On the other hand, assuming that the clock IN-B when the terminals "0" are selected is a clock IN-B0, then the phase difference between the clocks IN-B0 and OUT-A is a delay value Ta at the A clock driver 102. The phase comparator 112 outputs a delay value control signal in accordance with the phase difference between the clocks IN-A01 and IN-B0. Therefore, assuming that the clock IN-A0 after a lapse of sufficient time is a clock IN-A02, the clock IN-A02 has a phase difference of Ta from the clock OUT-A, similarly to the clock IN-B0. At this time, the delay value generated at the variable delay circuit 110 is represented by (Ta–Td), to be stored in the register circuit 117.

Next, the respective "1" terminals of the selector circuits 114, 115 and 116 are made effective in response to a select signal. At this time, a B clock outputted from the B clock output terminal 109 passes through the selector circuit 114 and variable delay circuit 110 to be inputted to the input terminal 131 of the phase comparator 112. The B clock outputted from the B clock output terminal 109 also passes through the variable delay circuit 111, B clock driver 103, B clock domain 105 and selector circuit 116 to be inputted to the input terminal 132 of the phase comparator 112. With this operation, a second phase comparison loop is formed.

Next, variations in the delay value applied to a B clock at the variable delay circuit 111 will be described referring to FIG. 5.

The variable delay circuit 111 shall have an initial delay value VDL2, and the B clock driver 103 shall have a delay value Tb. The clock IN-B when the terminals "1" are selected shall be a clock IN-B1, and its initial state shall be IN-B11. Then, the phase difference between the clocks IN-B11 and OUT-B is represented by (Tb+VDL2). On the other hand, assuming that the clock IN-A when the terminals "1" are selected is a clock IN-A1, then the phase difference between the clocks IN-A1 and OUT-B is represented by (Ta–Td) which is stored in the register circuit 117. The phase comparator 112 outputs a delay value control signal in accordance with the phase difference between the clocks IN-B11 and IN-A1. Therefore, assuming that the clock IN-B1 after a lapse of sufficient time is a clock IN-B12, the clock IN-B12 has a phase difference (Ta–Td) from the clock OUT-B, similarly to the clock IN-A1. At this time, a delay value generated at the variable delay circuit 111 is represented by (Ta–Td–Tb), to be stored in the register circuit 118.

Thereafter, a normal operation is conducted, whereby the delay of the A clock supplied for the A clock domain 104 is Ta, and that of the B clock supplied for the B clock domain 105 is the sum of (Ta–Td–Tb) and Tb, i.e., (Ta–Td).

With the above-described operation, a clock can be distributed to the B clock domain 105 that leads to a clock distributed to the A clock domain 104 in phase by the delay value Td generated at the CMOS buffer circuit 119.

As has been described, the semiconductor integrated circuit according to the present embodiment is provided with the CMOS buffer circuit having a desired delay value itself that is desired for phase difference management, whereby easy and highly accurate phase management between the clock domains can be performed without estimating delay values at the respective clock domains by circuit simulations.

Second Preferred Embodiment

Figure 6:
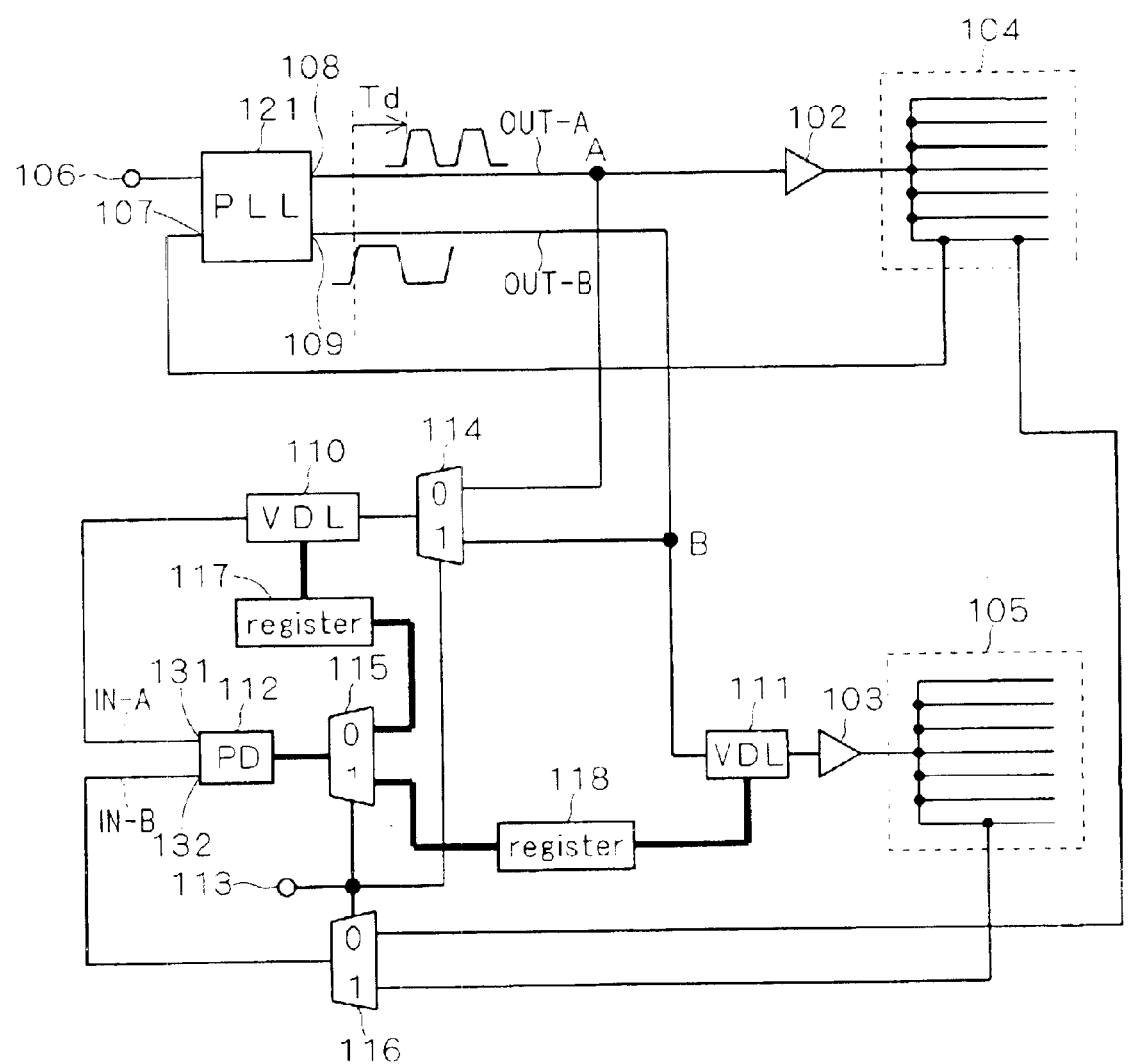
FIG. 6 is a circuit diagram showing phase management according to a second preferred embodiment of the present invention.

FIG. 6 is a circuit diagram showing phase management between a plurality of clock domains in a semiconductor integrated circuit according to a second preferred embodiment of the present invention.

The circuit shown in FIG. 6 is configured as the circuit shown in FIG. 1 except that the A clock output terminal 108 and the "0" input terminal of the selector circuit 114 are directly connected without using the CMOS buffer circuit 119 and the PLL circuit 101 is replaced by a PLL circuit 121. The PLL circuit 121 is configured as shown in FIG. 2 similarly to the PLL circuit 101 except that the voltage controlled oscillator 153 is replaced by a voltage controlled oscillator 191.

Figure 7:
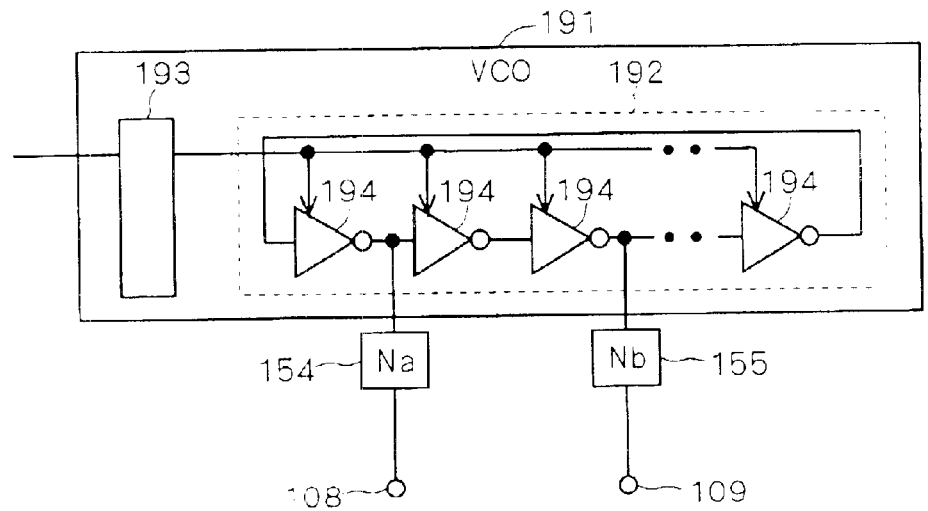
FIG. 7 is a voltage controlled oscillator according to the second preferred embodiment.

FIG. 7 shows a configuration of the voltage controlled oscillator 191. The voltage controlled oscillator 191 includes an oscillation control circuit 193 and a ring oscillator 192 in which an odd number of inverters 194 for varying a delay value through the oscillation control circuit 193 are connected, and has the frequency dividers 154 and 155 connected at different positions in the ring oscillator 192, thereby producing a phase difference between the A and B clocks. That is, the PLL circuit 121 operates as phase difference introducing circuit for introducing the phase difference required between the A clock domain 104 and the B clock domain 105 into the variable delay circuit 111. This phase difference is not indicated as a delay value, but indicated as an angle when the oscillation period of the ring oscillator 192 is converted to 360°, i.e., a phase angle. Therefore, a phase angle may be converted to a delay value in the case of managing a phase difference as a delay value between clock domains.

Components of the circuit shown in FIG. 6 having similar functions as those of FIG. 1 are assigned the same reference characters, and the circuit of FIG. 6 operates similarly to that of the first preferred embodiment except that the phase difference Td is generated at the PLL circuit 121. Thus, detailed explanation is omitted here.

As has been described, the semiconductor integrated circuit according to the present embodiment can perform phase management without using a CMOS buffer circuit having a predetermined delay value, as well as achieving the effect of the first preferred embodiment.

Third Preferred Embodiment

Figure 8:
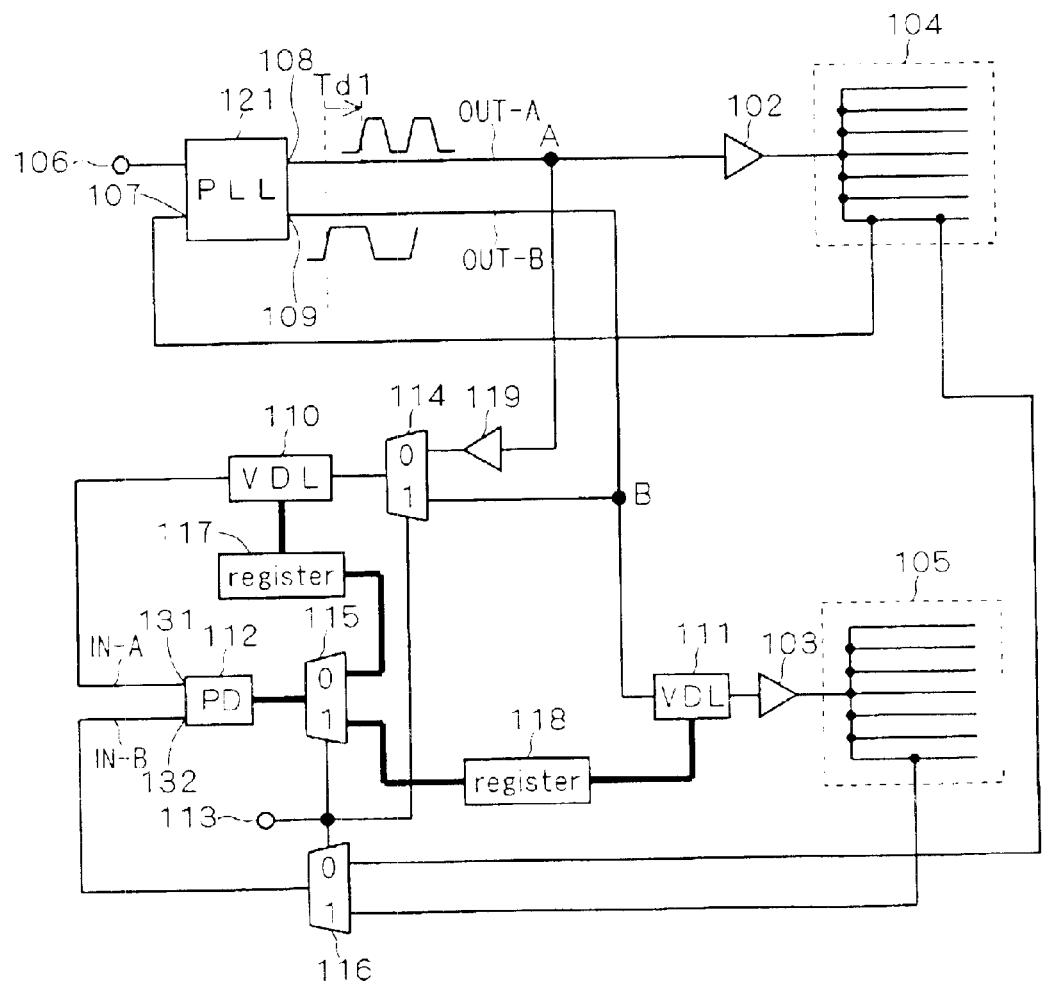
FIG. 8 is a circuit diagram showing phase management according to a third preferred embodiment of the present invention.

FIG. 8 is a circuit diagram showing phase management between a plurality of clock domains in a semiconductor integrated circuit according to a third preferred embodiment of the present invention.

The circuit shown in FIG. 8 is configured as the circuit shown in FIG. 6 except that the CMOS buffer circuit 119 is connected between the A clock output terminal 108 and the "0" input terminal of the selector circuit 114. That is, the first and second preferred embodiments are combined together, whereby the phase difference Td is generated based on a delay at the CMOS buffer circuit 119 in addition to a phase difference resulting from a phase angle at the PLL circuit 121.

Here, assuming that the phase difference resulting from a phase angle at the PLL circuit is Td1 (<Td) and a delay value at the CMOS buffer circuit 119 is Td2 (<Td), then Td=Td1+Td2.

Components of the circuit shown in FIG. 8 having similar functions as those of FIGS. 1 and 6 are assigned the same reference characters, and the circuit of FIG. 8 operates similarly to that of the first preferred embodiment except that the phase difference Td is generated at both the PLL circuit 121 and CMOS buffer circuit 119. Thus, detailed explanation is omitted here.

As has been described, the semiconductor integrated circuit according to the present embodiment, as well as achieving the effect of the first preferred embodiment, generates the phase difference based on the phase angle at the PLL circuit and the delay value at the CMOS buffer circuit, which can reduce the delay value to be provided for the CMOS buffer circuit as compared to the first preferred embodiment.

Fourth Preferred Embodiment

Figure 9:
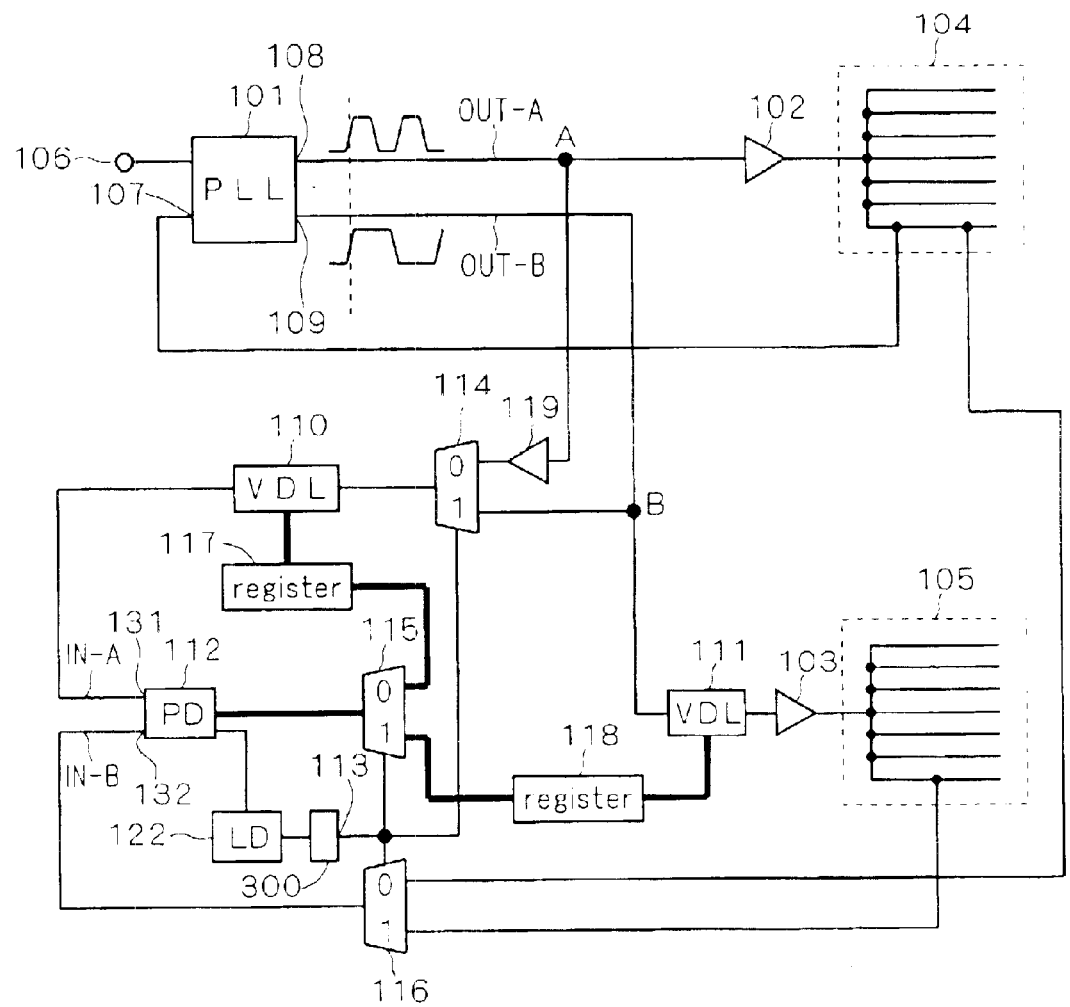
FIG. 9 is a circuit diagram showing phase management according to a fourth preferred embodiment.

FIG. 9 is a circuit diagram showing phase management between a plurality of clock domains in a semiconductor integrated circuit according to a fourth preferred embodiment of the present invention.

The circuit shown in FIG. 9 is configured as the circuit shown in FIG. 1 except that the output terminal of the phase comparator 112 is connected to an input terminal of a lock detecting circuit 122 and an output terminal of the lock detecting circuit 122 is connected to a select signal input terminal 113 through a latch circuit 300.

Figure 10:
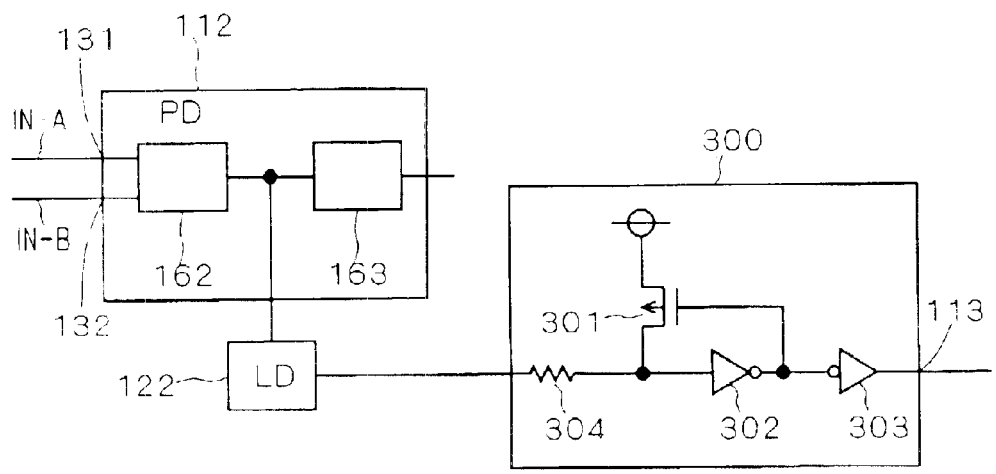
FIG. 10 is a circuit diagram showing a lock detecting circuit according to the fourth preferred embodiment.

FIG. 10 shows how the phase comparator 112 and lock detecting circuit 122 are connected. The phase difference outputted from the phase difference detecting circuit 162 is also inputted to the lock detecting circuit 122.

Next, the operation of the circuit of FIG. 9 will be described. When the clocks IN-A0 and IN-B0 having a phase difference of zero therebetween are inputted successively by a predetermined number of times in the state where the terminals "0" are selected, the lock detecting circuit 122 determines that the phase difference between the clocks IN-A0 and IN-B0 becomes zero, and outputs a select signal to the select signal input terminal 113 through the latch circuit 300, for selecting the terminals "1".

The latch circuit 300 has a function of holding "1" when "1" is inputted thereto from the lock detecting circuit 122 and maintaining stored contents unchanged when "0" is inputted thereto from the lock detecting circuit 122. Therefore, switching back to the terminals "0" does not occur even when the phase difference between the clocks IN-A0 and IN-B0 is not zero just after the terminals "0" are switched to "1".

FIG. 10 shows an example of the latch circuit 300. When the lock detecting circuit 122 outputs "1", "1" is inputted to an inverter 302, which then outputs "0" to an inverter 303, which then outputs "1" to the select signal input terminal 113. The output "0" from the inverter 302 is also inputted to the gate of a PMOS transistor 301, bringing the PMOS transistor 301 into a conducting state, whereby the potentials on both sides of a resistor 304 are brought into an H level, causing no current to pass through the resistor 304. Next, when the lock detecting circuit 122 outputs "0" in this state, current flows into the resistor 304 from a power potential, causing a voltage drop. Therefore, the inverter 302 receives an input of "1", and the contents stored in the latch circuit 300 remain unchanged, whereby "1" is outputted from the select signal input terminal 113.

Components of the circuit shown in FIG. 9 having similar functions as those of FIG. 1 are assigned the same reference characters, and the circuit of FIG. 9 operates similarly to that of the first preferred embodiment except that the lock detecting circuit 122 performs automatic switching of the selector circuits 114, 115 and 116. Thus, detailed explanation is omitted here.

As has been described, the semiconductor integrated circuit according to the present embodiment can perform automatic switching of the selector circuits without setting the timing of switching in response to a select signal, as well as achieving the effect of the first preferred embodiment.

Fifth Preferred Embodiment

Figure 11:
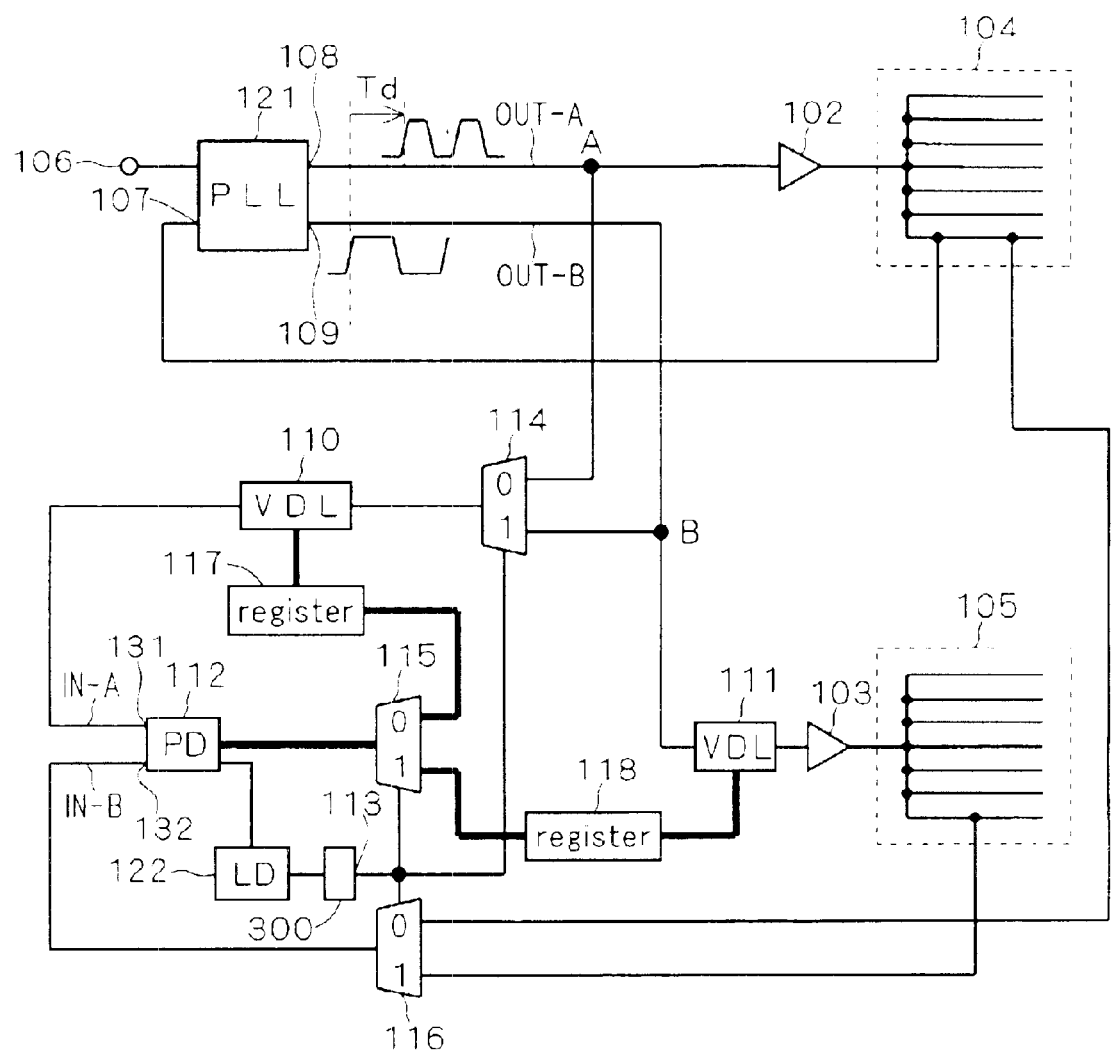
FIG. 11 is a circuit diagram showing phase management according to a fifth preferred embodiment of the present invention.

FIG. 11 is a circuit diagram showing phase management between a plurality of clock domains in a semiconductor integrated circuit according to a fifth preferred embodiment of the present invention.

The circuit shown in FIG. 11 is configured as the circuit shown in FIG. 9 except that the A clock output terminal 108 and the "0" input terminal of the selector circuit 114 are directly connected without using the CMOS buffer circuit 119 and the PLL circuit 101 is replaced by the PLL circuit 121. That is, the second and fourth preferred embodiments are combined together.

The PLL circuit 121 is configured as shown in FIG. 2 similarly to the PLL circuit 101 except that the voltage controlled oscillator 153 is replaced by the voltage controlled oscillator 191 shown in FIG. 7.

Components of the circuit shown in FIG. 11 having similar functions as those of FIGS. 6 and 9 are assigned the same reference characters, and the circuit of FIG. 11 operates similarly to that of the first preferred embodiment except that the phase difference Td is generated at the PLL circuit 121 and the lock detecting circuit 122 performs automatic switching of the selector circuits 114, 115 and 116. Thus, detailed explanation is omitted here.

As described, the semiconductor integrated circuit according to the present embodiment achieves the effects of both the second and fourth preferred embodiments.

Sixth Preferred Embodiment

Figure 12:
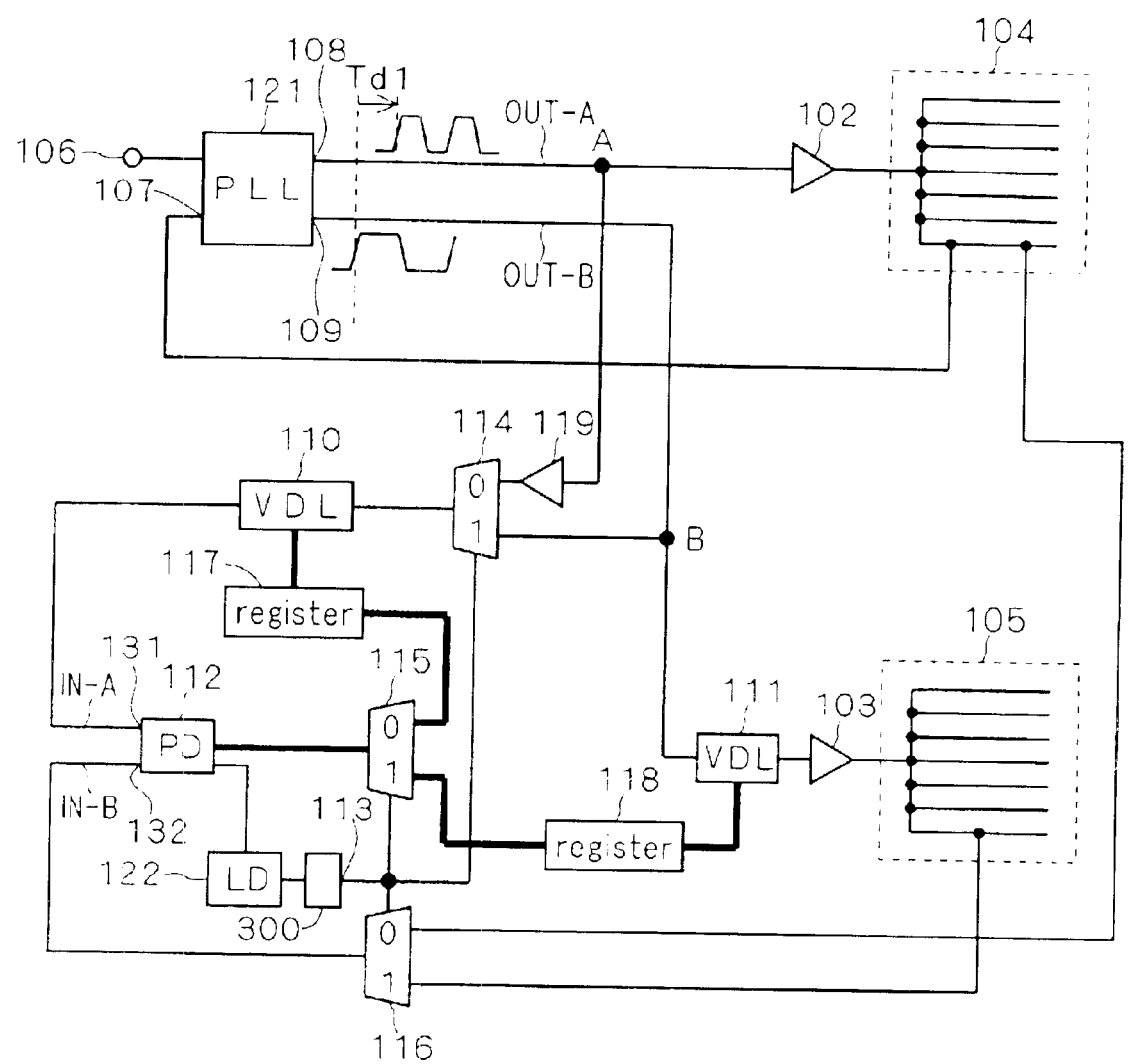
FIG. 12 is a circuit diagram showing phase management according to a sixth preferred embodiment of the present invention.

FIG. 12 is a circuit diagram showing phase management between a plurality of clock domains in a semiconductor integrated circuit according to a sixth preferred embodiment of the present invention.

The circuit shown in FIG. 12 is configured as the circuit shown in FIG. 11 except that the CMOS buffer circuit 119 is connected between the A clock output terminal 108 and the "0" input terminal of the selector circuit 114. That is, the third and fourth preferred embodiments are combined together.

Components of the circuit shown in FIG. 12 having similar functions as those of FIGS. 8 and 9 are assigned the same reference characters, and the circuit of FIG. 12 operates similarly to that of the first preferred embodiment except that the phase difference Td is generated based on a phase angle at the PLL circuit 121 and a delay value at the CMOS buffer circuit and the lock detecting circuit 122 performs automatic switching of the selector circuits 114, 115 and 116. Thus, detailed explanation is omitted here.

As described, the semiconductor integrated circuit according to the present embodiment achieves the effects of both the third and fourth preferred embodiments.

Seventh Preferred Embodiment

Figure 13:
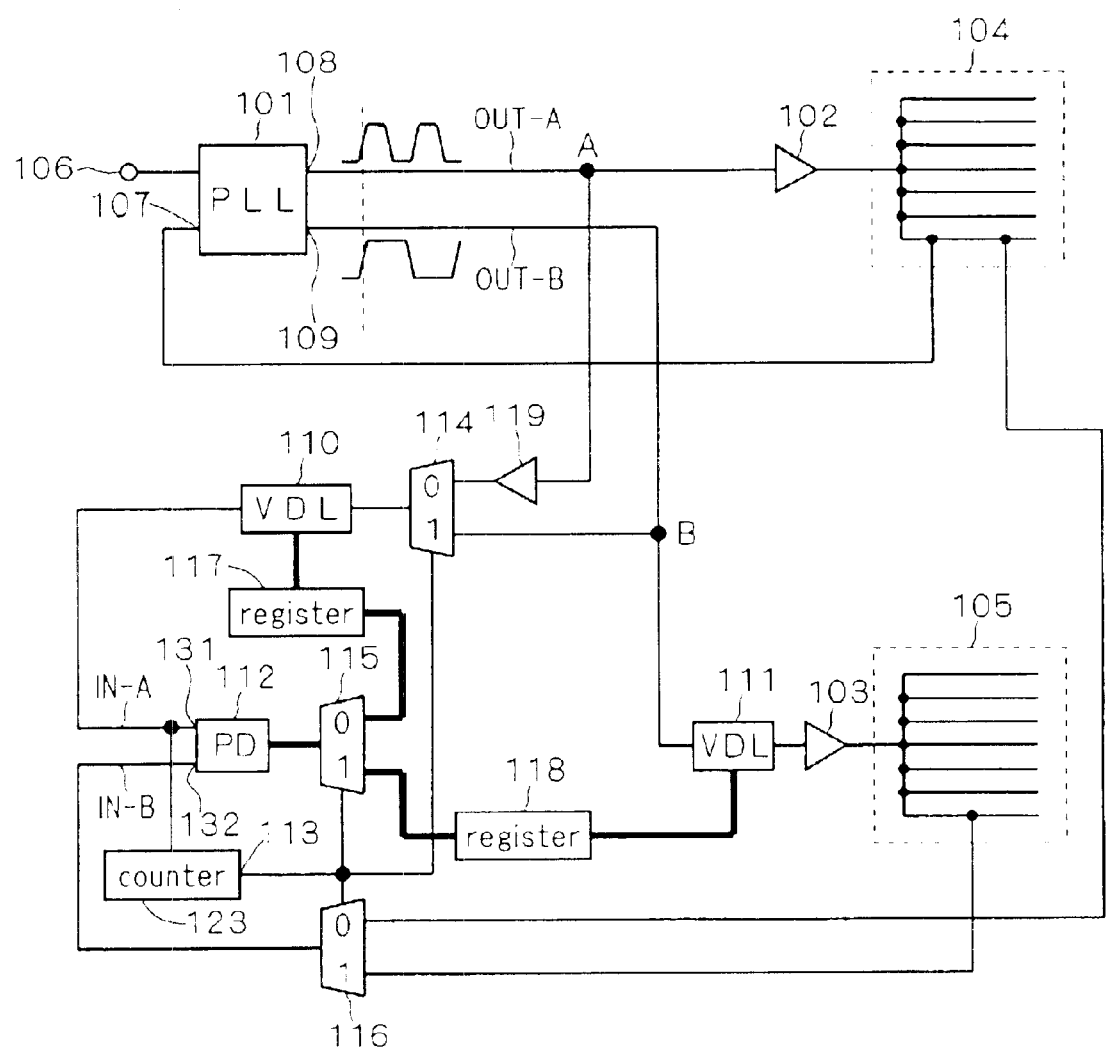
FIG. 13 is a circuit diagram showing phase management according to a seventh preferred embodiment of the present invention.

FIG. 13 is a circuit diagram showing phase management between a plurality of clock domains in a semiconductor integrated circuit according to a seventh preferred embodiment of the present invention.

The circuit shown in FIG. 13 is configured as the circuit shown in FIG. 1 except that the input terminal 131 or 132 of the phase comparator 112 is connected to an input terminal of a counter circuit 123 and an output terminal of the counter circuit 123 is connected to the select signal input terminal 113.

Next, the operation of the circuit of FIG. 13 will be described. Upon counting voltage transition of the clock IN-A or IN-B by a predetermined number of times in the state where the terminals "0" are selected, the counter circuit 123 selects the terminals "1" in response to a select signal. Further, the counter circuit 123 performs alternate switching between the terminals "1" and "0" every time it counts the predetermined number of times. Therefore, the operation is performed such that the delay values at the variable delay circuits 110 and 111 are alternately varied.

Components of the circuit shown in FIG. 13 having similar functions as those of FIG. 1 are assigned the same reference characters, and the circuit of FIG. 13 operates similarly to that of the first preferred embodiment except that the counter circuit 123 performs automatic switching of the selector circuits 114, 115 and 116. Thus, detailed explanation is omitted here.

As has been described, the semiconductor integrated circuit according to the present embodiment can perform automatic switching of the selector circuits without setting the timing of switching in response to a select signal, as well as achieving the effect of the first preferred embodiment. Further, the delay values at the variable delay circuits 110 and 111 are alternately varied, allowing stable phase management even when the delay values Ta and Tb are varied due to variations in temperature and the like during the operation. The counter circuit 123 may be used in the case where the phase difference Td is generated at the PLL circuit as in the second and third preferred embodiments.

Eighth Preferred Embodiment

Figure 14:
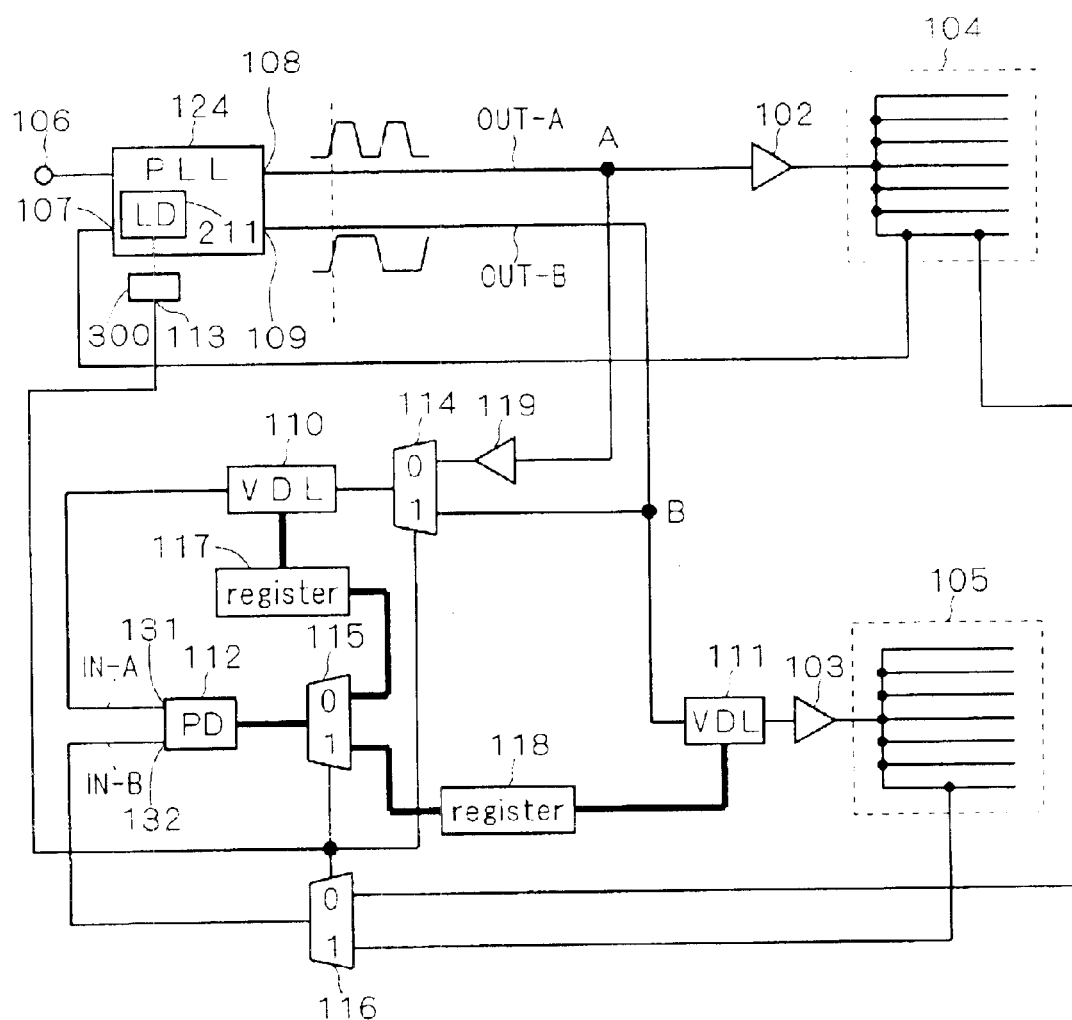
FIG. 14 is a circuit diagram showing phase management according to an eighth preferred embodiment of the present invention.

FIG. 14 is a circuit diagram showing phase management between a plurality of clock domains in a semiconductor integrated circuit according to an eighth preferred embodiment of the present invention.

The circuit shown in FIG. 14 is configured as the circuit shown in FIG. 9 except that the lock detecting circuit 122 is not provided and the PLL circuit 101 is replaced by a PLL circuit 124 having a lock detecting circuit 211.

FIG. 15 shows a configuration of the PLL circuit 124. The PLL circuit 124 is configured as the PLL circuit 101 shown in FIG. 2 except that the output terminal of the phase comparator 151 is also connected to an input terminal of the lock detecting circuit 211 and an output terminal of the lock detecting circuit 211 is connected to the select signal input terminal 113.

Next, the operation of the circuit of FIG. 15 will be described. The phase difference between a reference clock and a feedback clock inputted to the PLL circuit 124 is detected by the phase comparator 151 and is inputted to the lock detecting circuit 211.

In a general PLL circuit, a time elapsed before the phase difference between the reference clock and feedback clock becomes zero is, in many cases, longer than that elapsed before the phase difference between the clocks IN-A and IN-B becomes zero. Therefore, when the clocks IN-A and IN-B having a phase difference of zero therebetween are inputted successively by a predetermined number of times in the state where the terminals "0" are selected, the lock detecting circuit 211 determines that the phase difference between the clocks IN-A0 and IN-B0 becomes zero, and outputs a select signal for selecting the terminals "1".

Components of the circuit shown in FIG. 14 having similar functions as those of FIG. 9 are assigned the same reference characters, and the circuit of FIG. 14 operates similarly to that of the fourth preferred embodiment except that the lock detecting circuit 211 performs automatic switching of the selector circuits 114, 115 and 116 in place of the lock detecting circuit 122. Thus, detailed explanation is omitted here.

As described, according to the semiconductor integrated circuit according to the present embodiment, the use of the lock detecting circuit 211 embedded in the PLL circuit 124 allows layout area and power consumption to be reduced as compared to the case of providing a separate lock detecting circuit. The PLL circuit 124 may be used in the case where the phase difference Td is generated at the PLL circuit as in the second and third preferred embodiments.

Ninth Preferred Embodiment

Figure 16:
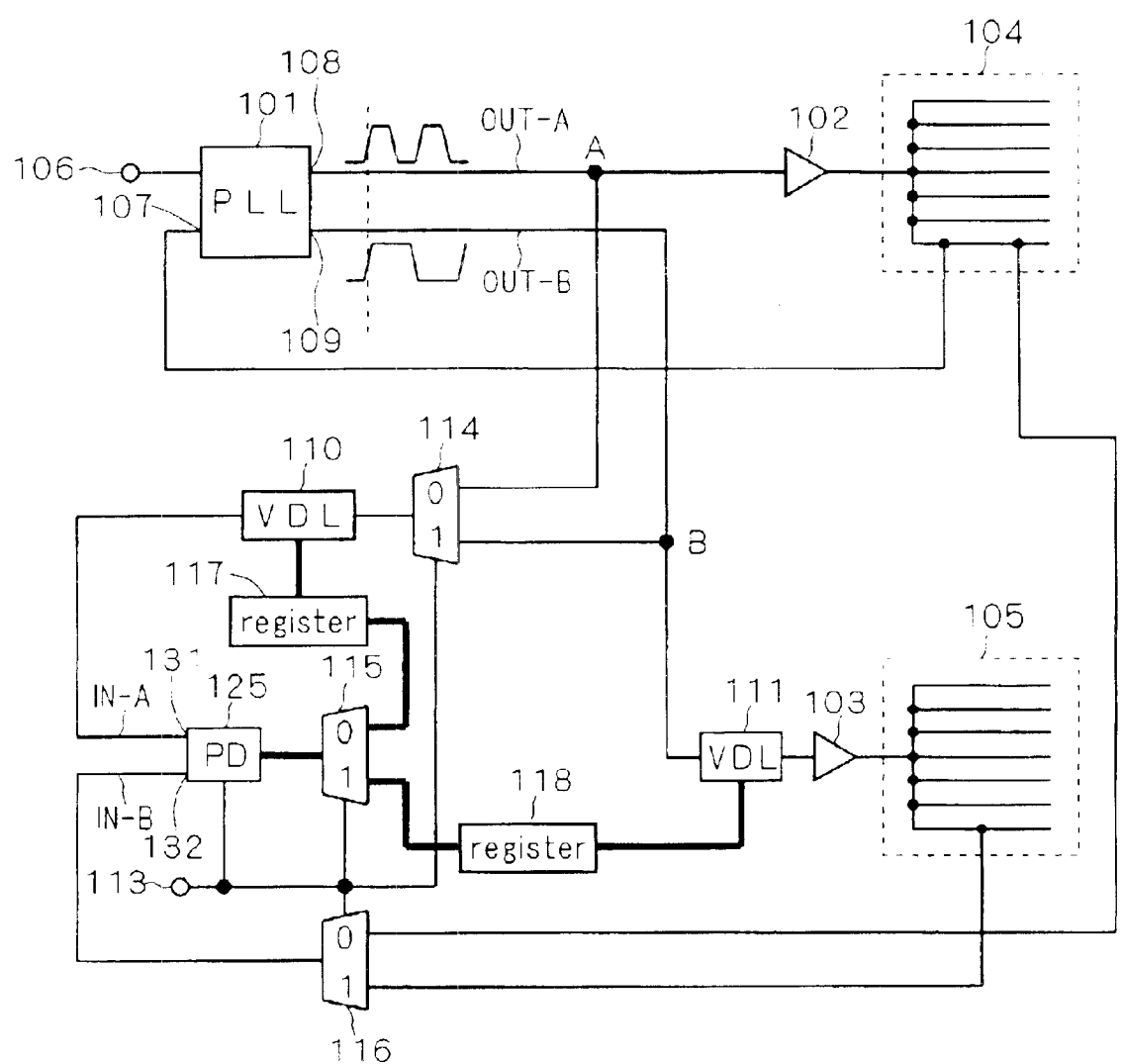
FIG. 16 is a circuit diagram showing phase management according to a ninth preferred embodiment of the present invention.

FIG. 16 is a circuit diagram showing phase management between a plurality of clock domains in a semiconductor integrated circuit according to a ninth preferred embodiment of the present invention.

The circuit shown in FIG. 16 is configured as the circuit shown in FIG. 1 except that the A clock output terminal 108 and the "0" input terminal of the selector circuit 114 are directly connected without using the CMOS buffer circuit 119 and the phase comparator 112 is replaced by a phase comparator 125. The select signal input terminal 113 is connected to an input terminal of the phase comparator 125.

Components of the circuit shown in FIG. 16 having similar functions as those of FIG. 1 are assigned the same reference characters, and the circuit of FIG. 16 operates similarly to that of the first preferred embodiment.

Figure 17:
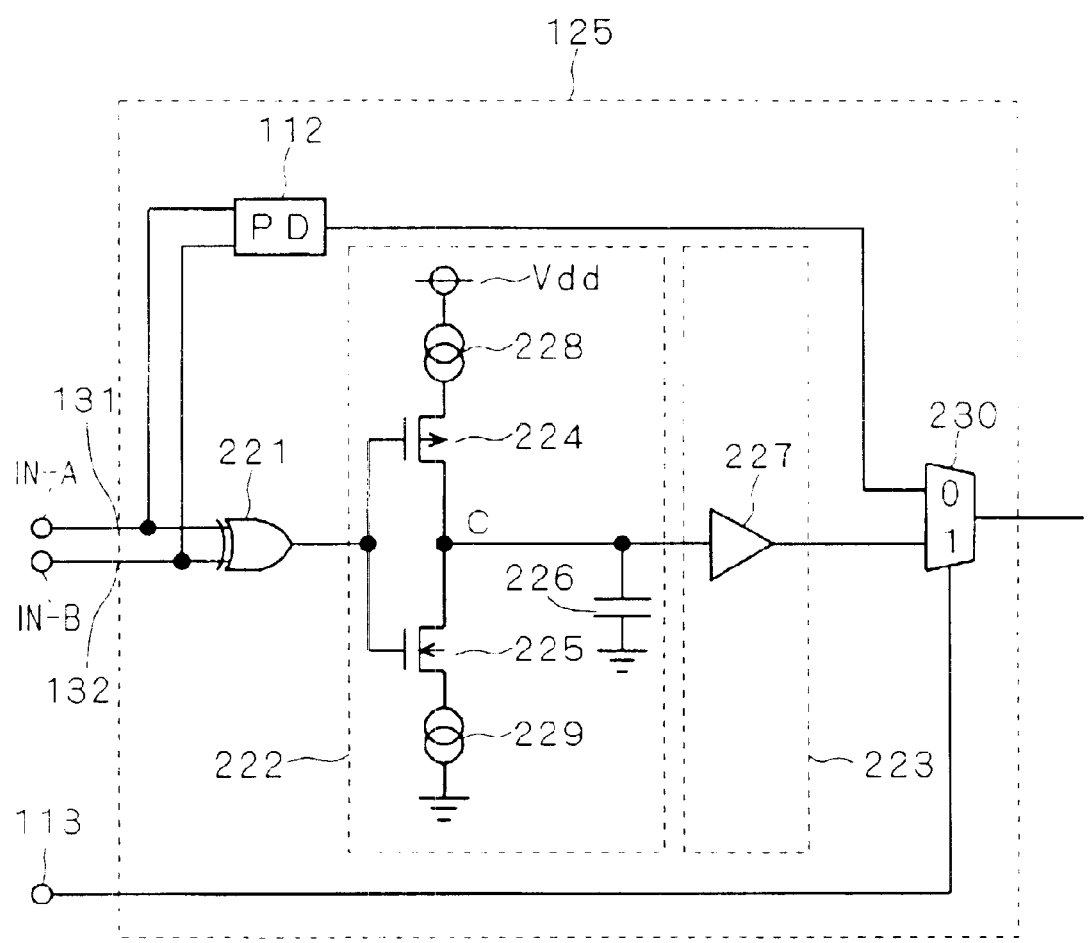
FIG. 17 is a circuit diagram showing a phase comparator according to the ninth preferred embodiment.

FIG. 17 shows a configuration of the phase comparator 125. The phase comparator 125 includes the phase comparator 112, an XOR circuit 221, a phase difference detecting circuit 222, a coding device 223 and a selector circuit 230.

The phase difference detecting circuit 222 includes a PMOS transistor 224, an NMOS transistor 225, a constant current circuit 228, a constant current circuit 229 and a capacitor 226. The coding device 223 includes an analog-digital converter 227.

The clocks IN-A and IN-B are inputted to the XOR circuit 221 from the input terminals 131 and 132, respectively. The XOR circuit 221 has its output terminal connected to the respective gates of the PMOS transistor 224 and NMOS transistor 225. The PMOS transistor 224 has its source connected to the constant current circuit 228, and the constant current circuit 228 is connected to a power supply potential Vdd. The NMOS transistor 225 has its source connected to the constant current circuit 229, and the constant current circuit 229 is grounded. The respective drains of the PMOS transistor 224 and NMOS transistor 225 are connected together at a contact C. The contact C is connected to an input terminal of the analog-digital converter 227 and a terminal of the capacitor 226 having the other terminal grounded. The analog-digital converter 227 has its output terminal connected to a "1" input terminal of the selector circuit 230.

The input terminals of the XOR circuit 221 are also connected to input terminals of the phase comparator 112, respectively. The phase comparator 112 has its output terminal connected to a "0" input terminal of the selector circuit 230. A select signal is inputted to the selector circuit 230 from the select signal input terminal 113, and an output of the selector circuit 230 is an output of the phase comparator 125.

Next, the operation of the phase comparator 125 will be described. When the terminals "0" are selected, the phase comparator 112 causes the selector circuit 230 to output a delay value control signal such that the clocks IN-A and IN-B have no phase difference therebetween, similarly to the first preferred embodiment.

When the terminals "1" are selected, the clocks IN-A and IN-B are inputted to the XOR circuit 221, whose output is inputted to the respective gates of the PMOS transistor 224 and NMOS transistor 225. When there is a great phase difference between the inputted clocks IN-A and IN-B, H level signals form a large proportion of output signals from the XOR circuit 221, whereas L level signals form a large proportion when there is a small phase difference between the clocks IN-A and IN-B. Thus, a great phase difference between the clocks IN-A and IN-B will make current flowing into the constant current circuit 229 from the capacitor 226 through the NMOS transistor 225 greater than that flowing into the capacitor 226 from the constant current circuit 228 through the PMOS transistor 224, causing capacity to discharge. The potential at the contact C is outputted as a delay value control signal (code) from the analog-digital converter 227 to the "1" terminal of the selector circuit 230, and then outputted from the "1" terminal of the selector circuit 230 to the register circuit 118. The register circuit 118 stores the delay value control signal and thereafter outputs it to the variable delay circuit 111. Thus, the current flowing into the capacitor 226 from the constant current circuit 228 through the PMOS transistor 224 and that flowing into the constant current circuit 229 from the capacitor 226 through the NMOS transistor 225 become identical after a lapse of sufficiently long time. The phase difference between the clocks IN-A and IN-B when arrived at this steady state is determined by values of current flowing through the constant current circuits 228 and 229. That is, the phase comparator 125 including two phase comparators having equilibrium points different from each other operates as phase difference introducing circuit for introducing the phase difference required between the A clock domain 104 and the B clock domain 105 into the variable delay circuit 111. Here, the phase difference shall be Td.

Next, the operation of the circuits shown in FIGS. 16 and 17 will be described. First, the respective "0" terminals of the selector circuits 114, 115, 116 and 230 are made effective in response to a select signal. At this time, outputted from the selector circuit 230 is an output signal from the phase comparator 112.

At this time, an A clock outputted from the A clock output terminal 108 is inputted to the input terminal 131 of the phase comparator 125 through the selector circuit 114 and variable delay circuit 110. The A clock outputted from the A clock output terminal 108 is also inputted to the input terminal 132 of the phase comparator 125 through the A clock driver 102, A clock domain 104 and selector circuit 116. With this operation, the first phase comparison loop is formed.

Figure 18:
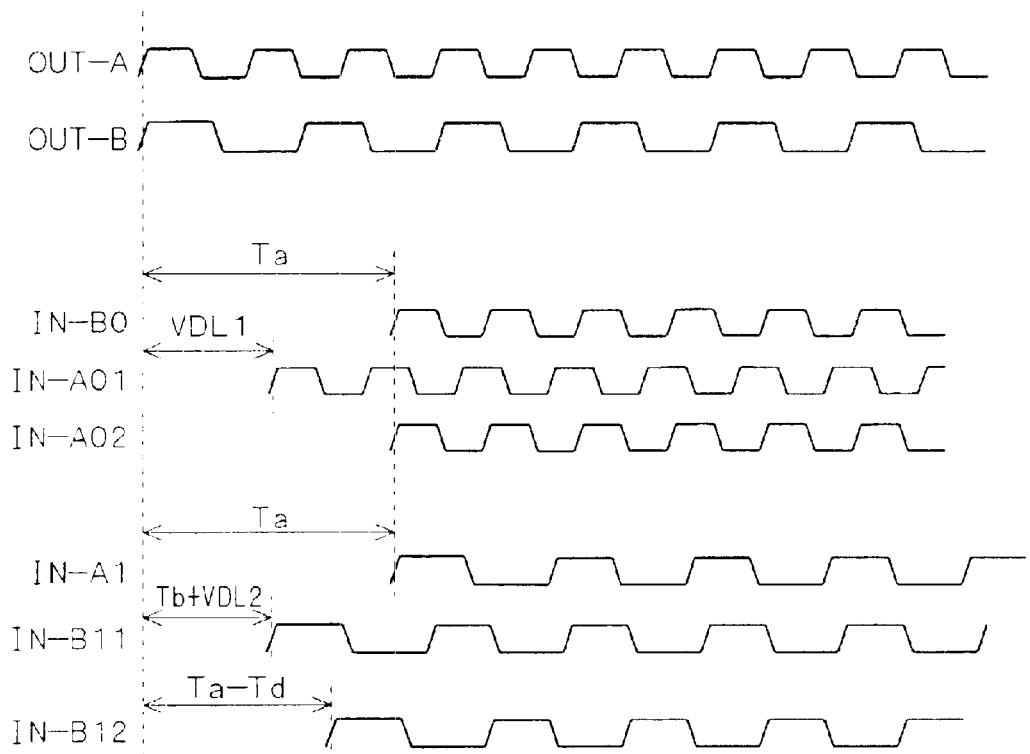
FIG. 18 is a timing chart showing the phase management according to the ninth preferred embodiment.
Figure 19:
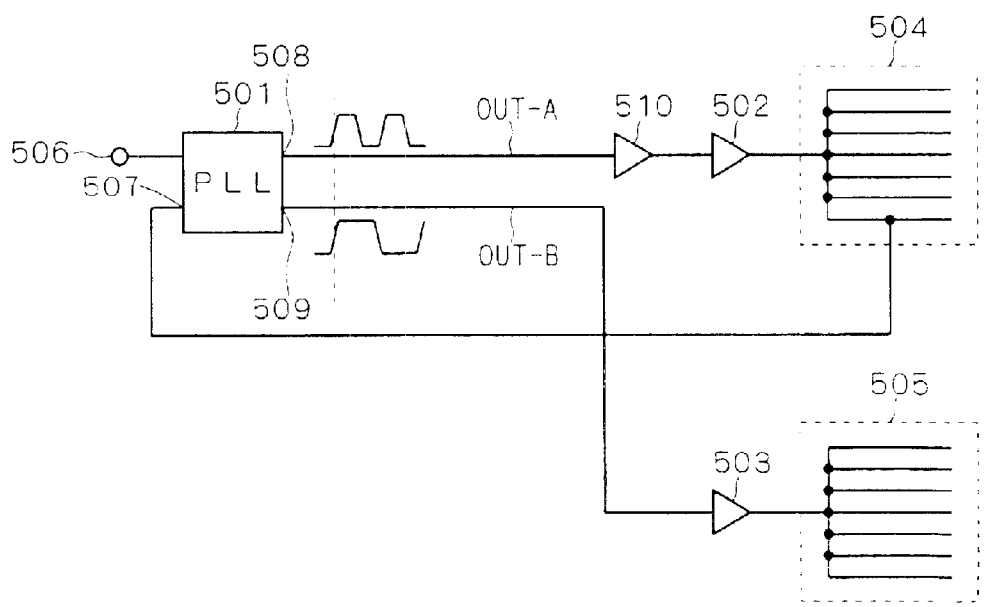
FIG. 19 is a circuit diagram showing conventional phase management.

Now, variations in the delay value applied to an A clock at the variable delay circuit 110 will be described referring to FIG. 18.

The variable delay circuit 110 shall have an initial delay value VDL1. The clock IN-A when the terminals "0" are selected shall be a clock IN-A0, and its initial state shall be IN-A01. Then, the phase difference between the clocks IN-A01 and OUT-A is VDL1. On the other hand, assuming that the clock IN-B when the terminals "0" are selected is a clock IN-B0, then the phase difference between the clocks IN-B0 and OUT-A is the delay value Ta at the A clock driver 102. The phase comparator 112 outputs a delay value control signal in accordance with the phase difference between the clocks IN-A01 and IN-B0. Therefore, assuming that the clock IN-A0 after a lapse of sufficient time is a clock IN-A02, the clock IN-A02 has a phase difference of Ta from the clock OUT-A, similarly to the clock IN-B0. At this time, the delay value generated at the variable delay circuit 110 is Ta, to be stored in the register circuit 117.

Next, the respective "1" terminals of the selector circuits 114, 115, 116 and 230 are made effective in response to a select signal. At this time, a B clock outputted from the B clock output terminal 109 is inputted to the input terminal 131 of the phase comparator 125 through the selector circuit 114 and variable delay circuit 110. The B clock outputted from the B clock output terminal 109 is also inputted to the input terminal 132 of the phase comparator 125 through the variable delay circuit 111, B clock driver 103, B clock domain 105 and selector circuit 116. With this operation, the second phase comparison loop is formed.

Next, variations in the delay value applied to a B clock at the variable delay circuit 111 will be described referring to FIG. 18.

The variable delay circuit 111 shall have an initial delay value VDL2, and the B clock driver 103 shall have the delay value Tb. The clock IN-B when the terminals "1" are selected shall be a clock IN-B1, and its initial state shall be IN-B11. Then, the phase difference between the clocks IN-B11 and OUT-B is represented by (Tb+VDL2). On the other hand, assuming that the clock IN-A when the terminals "1" are selected is a clock IN-A1, then the phase difference between the clocks IN-A1 and OUT-B is a delay value Ta stored in the register circuit 117. The phase comparator 125 outputs a delay value control signal in accordance with the phase difference between the clocks IN-A1 and IN-B11. Therefore, assuming that the clock IN-B1 after a lapse of sufficient time is a clock IN-B12, the phase difference between the clocks IN-B12 and OUT-B is represented by (Ta−Td). At this time, the delay value generated at the variable delay circuit 111 is represented by (Ta−Td−Tb), to be stored in the register circuit 118.

Thereafter, a normal operation is conducted, whereby the delay of the A clock supplied for the A clock domain 104 is Ta, and that of the B clock supplied for the B clock domain 105 is the sum of (Ta−Td−Tb) and Tb, i.e., (Ta−Td).

With the above-described operation, a clock can be distributed to the B clock domain 105 that leads to a clock distributed to the A clock domain 104 in phase by the delay value Td generated at the phase comparator 125.

As has been described, the semiconductor integrated circuit according to the present embodiment can perform phase management without using a CMOS buffer circuit or a PLL circuit having a ring oscillator, as well as achieving the effect of the first preferred embodiment. The phase comparator 125 may be used in the case where the phase difference Td is generated at the PLL circuit as in the second and third preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit comprising:
   a phase locked loop circuit configured to generate a first clock and a second clock;
   a first clock driver configured to distribute said first clock to a first clock domain;
   a second clock driver configured to distribute said second clock to a second clock domain;
   a first variable delay circuit provided on a first phase comparison loop including said first clock driver and a phase comparator, said first variable delay circuit having a delay determined by an output of said phase comparator;
   a second variable delay circuit provided on a second phase comparison loop including said second clock driver, said first variable delay circuit and said phase comparator, said second variable delay circuit having a delay determined by an output of said phase comparator;
   a selector circuit configured to switch between said first phase comparison loop and said second phase comparison loop; and
   a phase difference introducing circuit configured such that a predetermined phase difference to be provided between said first and second clock domains is reflected in said delay of said second variable delay circuit.

2. The semiconductor integrated circuit according to claim 1, wherein
   said phase difference introducing circuit is a delay circuit provided in said first phase comparison loop.

3. The semiconductor integrated circuit according to claim 1, wherein
   said phase difference introducing circuit is said phase locked loop circuit configured to generate said first and second clocks having a phase difference therebetween equal to said predetermined phase difference.

4. The semiconductor integrated circuit according to claim 1, wherein
   said phase difference introducing circuit includes:
   a delay circuit provided in said first phase comparison loop; and
   said phase locked loop circuit configured to generate said first and second clocks having a phase difference smaller than said predetermined phase difference.

5. The semiconductor integrated circuit according to claim 1, wherein
   said phase difference introducing circuit is said phase comparator including first and second phase comparators which are provided with respective equilibrium points, said equilibrium points having a difference therebetween that corresponds to said predetermined phase difference.

6. The semiconductor integrated circuit according to claim 1, further comprising a lock detecting circuit configured to control switching of said selector circuit.

7. The semiconductor integrated circuit according to claim 6, wherein
   said phase locked loop circuit includes said lock detecting circuit.

8. The semiconductor integrated circuit according to claim 1, further comprising a counter circuit configured to control switching of said selector circuit.

* * * * *